(12) United States Patent
Pan et al.

(10) Patent No.: US 9,236,469 B2
(45) Date of Patent: Jan. 12, 2016

(54) HIGH-VOLTAGE LDMOS INTEGRATED DEVICE

(71) Applicants: Peking University Founder Group Co., Ltd., Beijing (CN); Founder Microelectronics International Co., Ltd., Shenzhen (CN)

(72) Inventors: Guangran Pan, Shenzhen (CN); Jincheng Shi, Shenzhen (CN); Zhenjie Gao, Shenzhen (CN); Yan Wen, Shenzhen (CN)

(73) Assignees: Peking University Founder Group Co., LTD., Beijing (CN); Founder Microelectronics International Co., LTD., Shenzhen (CN)

( * ) Notice: Subject to any disclaimer, the term of this patent is extended or adjusted under 35 U.S.C. 154(b) by 61 days.

(21) Appl. No.: 14/089,906

(22) Filed: Nov. 26, 2013

(65) Prior Publication Data

US 2014/0145262 A1    May 29, 2014

(30) Foreign Application Priority Data

Nov. 28, 2012   (CN) .......................... 2012 1 0497368

(51) Int. Cl.
| | |
|---|---|
| H01L 29/76 | (2006.01) |
| H01L 29/78 | (2006.01) |
| H01L 29/08 | (2006.01) |
| H01L 29/423 | (2006.01) |
| H01L 29/06 | (2006.01) |
| H01L 29/10 | (2006.01) |

(52) U.S. Cl.
CPC ........ *H01L 29/7816* (2013.01); *H01L 29/0692* (2013.01); *H01L 29/0847* (2013.01); *H01L 29/0878* (2013.01); *H01L 29/7835* (2013.01); *H01L 29/0634* (2013.01); *H01L 29/1045* (2013.01); *H01L 29/4238* (2013.01); *H01L 29/42368* (2013.01)

(58) Field of Classification Search
CPC .............. H01L 29/0696; H01L 29/407; H01L 29/4238; H01L 29/7811; H01L 29/7813; H01L 29/42368; H01L 29/66325; H01L 29/0646; H01L 29/7393; H01L 29/0878; H01L 29/7816; H01L 29/66681
USPC .......... 257/141, 339, 335, 492–493, 404, 367
See application file for complete search history.

(56) References Cited

U.S. PATENT DOCUMENTS

| | | | | |
|---|---|---|---|---|
| 5,258,636 | A * | 11/1993 | Rumennik et al. | 257/339 |
| 5,633,521 | A * | 5/1997 | Koishikawa | 257/336 |
| 6,207,994 | B1 * | 3/2001 | Rumennik et al. | 257/342 |
| 2008/0079072 | A1 * | 4/2008 | Lee | 257/335 |
| 2008/0197418 | A1 * | 8/2008 | Parthasarathy et al. | 257/367 |

* cited by examiner

*Primary Examiner* — Dung Le
(74) *Attorney, Agent, or Firm* — Renner, Otto, Boisselle & Sklar, LLP

(57) ABSTRACT

The invention discloses a high-voltage LDMOS integrated device, which is interdigitally structured in a plan view and which including: a first area corresponding to a source fingertip area, wherein a first sectional structure of the first area particularly includes: a first drain; and a first longitudinal voltage-withstanding buffer layer located below the first drain and consisted of a first deep N-well and a first low-voltage N-well, wherein the first low-voltage N-well is located in the first deep-N well, and the first deep-N well is located in a P-type substrate; and a second area non-overlapping with the first area, wherein a second sectional structure of the second area particularly includes: a second drain; and a second longitudinal voltage-withstanding buffer layer located below the second drain and consisted of a second deep N-well and a second low-voltage N-well.

9 Claims, 2 Drawing Sheets

--Prior Art--

--Prior Art--

HIGH-VOLTAGE LDMOS INTEGRATED DEVICE

FIELD OF THE INVENTION

The present invention relates to the field of microelectronics and particularly to a high-voltage LDMOS integrated device.

BACKGROUND OF THE INVENTION

A Lateral Double-diffusion Metal Oxide Semiconductor field effect transistor is abbreviated as a LDMOS.

A Complementary Metal Oxide Semiconductor is abbreviated as a CMOS.

A Bipolar Transistor is abbreviated as a Bipolar.

The Bipolar, the CMOS and the LDMOS all belong to semiconductor devices, and these three semiconductor devices can be fabricated in the same chip in a process, where an integrated circuit product in which the three semiconductor devices are integrated in a single chip is referred to as a BCD (Bipolar-CMOS-DMOS) chip. The LDMOS device is the most complicated in structure among these three devices integrated in the BCD chip.

The highest operating voltage of the BCD chip is equal to the highest operating voltage of the LDMOS integrated therein. As per the operating voltage of a BCD, the BCD with an operating voltage above 200 volts is typically referred to as a high-voltage BCD, in other words, one or more LDMOS devices at an operating voltage above 200 volts have to be integrated in the high-voltage BCD.

The device performance of a high-voltage LDMOS directly decides the performance of the entire high-voltage BCD chip, and the device structure and manufacturing method of the high-voltage LDMOS directly decides the process complexity of the entire high-voltage BCD chip.

An LDMOS is consisted of a body area, a source area, a drain area, a buffer layer, a gate oxide layer and a poly-silicon gate, where the source area, the drain area and the poly-silicon gate correspond respectively to three electrodes which are a source, a drain and a gate, and the buffer layer is configured to improve voltage robustness of the drain, and the highest rated operating voltage of the LDMOS becomes higher with a higher breakthrough voltage of the drain (the highest voltage withstood by the drain).

However the inventors of this application have identified during making of a technical solution in embodiments of the invention at least the following technical problems in the prior art:

In the prior art, as illustrated in FIG. 4 and FIG. 5, a N-type epitaxial layer is typically used as a longitudinal voltage-withstanding buffer layer in the high-voltage LDMOS integrated device, and the N-type epitaxial layer area located right below the N+ drain area tends to be depleted and broken through upon a reverse bias, so the breakthrough voltage of the drain and consequently the operating voltage of the high-voltage LDMOS integrated device has to be improved by increasing the thickness of the N-type epitaxial layer, but the use of the epitaxial layer and an increase in thickness of the epitaxial layer for an improvement in operating voltage of the high-voltage LDMOS integrated device may complicate the process and increase the cost of the process.

SUMMARY OF THE INVENTION

Embodiments of this application provide a high-voltage LDMOS integrated device so as to address the technical problem in the prior art of a complicated process and an increased cost as a result of the use of an epitaxial layer for an improvement in operating voltage of the high-voltage LDMOS integrated device, thus making it possible to achieve a technical effect of an improvement in operating voltage of the high-voltage LDMOS integrated device without an epitaxial layer.

An embodiment of the invention provides a high-voltage LDMOS integrated device, which is interdigitally structured in a plan view and which includes:
 a first area corresponding to a source fingertip area, wherein a first sectional structure of the first area particularly includes:
 a first drain; and
 a first longitudinal voltage-withstanding buffer layer located below the first drain and consisted of a first deep N-well and a first low-voltage N-well, wherein the first low-voltage N-well is located in the first deep-N well, and the first deep-N well is located in a P-type substrate; and
 a second area non-overlapping with the first area, wherein a second sectional structure of the second area particularly includes:
 a second drain; and
 a second longitudinal voltage-withstanding buffer layer located below the second drain and consisted of a second deep N-well and a second low-voltage N-well, wherein the second low-voltage N-well is located in the second deep-N well, and the second deep-N well is located in the P-type substrate.

Preferably the first sectional structure further includes:
 a first body area located in the P-type substrate and consisted of a first P-well.

Preferably the second sectional structure further includes:
 a second body area located in the P-type substrate and consisted of a second P-well.

Preferably the first sectional structure further includes:
 a first transversal voltage-withstanding buffer layer consisted of the P-type substrate, a first high-voltage N-well located in the P-type substrate and the first low-voltage N-well.

Preferably the second sectional structure further includes:
 a second transversal voltage-withstanding buffer layer consisted of a second high-voltage N-well located in the P-type substrate and the second low-voltage N-well.

Preferably the high-voltage LDMOS integrated device further includes a gate oxide layer formed in a third area on the first area and the second area.

Preferably the high-voltage LDMOS integrated device further includes a field oxide layer formed in a fourth area non-overlapping with the third area, wherein the fourth area belongs to the first area or the second area.

Preferably the high-voltage LDMOS integrated device further includes a poly-silicon gate formed in a fifth area on the third area or the fourth area.

Preferably the high-voltage LDMOS integrated device further includes P+ and N+ sources formed below the gate oxide layer in the third area non-overlapping with the fifth area.

One or more technical solutions in the embodiments of the invention have at least the following technical effects or advantages:

1. In the embodiments of the invention, the deep N-well and the low-voltage N-well are used as the longitudinal voltage-withstanding buffer layer of the drain, and since the doping concentration of the deep N-well is low, the PN junction consisted of the deep N-well and the P-type substrate can withstand high voltage of the drain; and since the doping concentration of the low-voltage N-well is higher than that of the deep N-well, the buffer layer can be prevented from being fully depleted longitudinally and consequently reaching the breakthrough voltage prematurely while the drain withstands high voltage, thereby improving the operating voltage of the high-voltage LDMOS integrated device above 200 volts. Since both the deep N-well and the low-voltage N-well are common structures in a CMOS process, it is possible to address effectively the problem in the prior art of a complicated process and an increased cost as a result of the use of an epitaxial layer for an improvement in operating voltage of the high-voltage LDMOS integrated device and to further achieve technical effects of a simple and convenient process at a low cost while improving the operating voltage of the high-voltage LDMOS integrated device.

2. In the embodiments of the invention, the P-well is used as the body area, and since the depth of the P-well is slightly different from the high-voltage N-well and the low-voltage N-well, P-well doping can be performed after (or before) the process steps of high-voltage N-well and low-voltage N-well doping, and then the P-well can be formed through diffusion (junction pushing) together with the high-voltage N-well and the low-voltage N-well. Since the high-voltage N-well, the low-voltage N-well and the P-well are all common structures in the CMOS process, so the P-well can be used as the body area for a simplified process flow and easy compatibility with the CMOS process.

3. In the embodiments of the invention, in the second area, the high-voltage N-well and the low-voltage N-well are used as the transversal voltage-withstanding buffer layer of the drain; and the doping concentration of the high-voltage N-well is low, and the doping concentration of the low-voltage N-well are high, so when the drain withstands high voltage, the high-voltage N-well is fully depleted and the low-voltage N well is partially depleted. Since the breakthrough voltage of the drain of the LDMOS is related directly to the width of the transversal depleted layer, full depletion of the high-voltage N-well facilitates an improvement in breakthrough voltage of the LDMOS, and partial depletion of the low-voltage N-well can prevent the buffer layer from being fully depleted horizontally and consequently reaching the breakthrough voltage prematurely while the drain withstands high voltage, thereby achieving a technical effect of further improving the operating voltage of the high-voltage LDMOS integrated device 4. In the embodiments of the invention, in the first area, the P-type substrate, the high-voltage N-well and the low-voltage N-well are used as the transversal voltage-withstanding buffer layer of the drain; and both the doping concentration of the high-voltage N-well and the doping concentration of the P-type substrate are low, and the reverse breakthrough voltage of the PN junction consisted of them is high, so the high-voltage N-well is fully depleted and the low-voltage N well is partially depleted before a reverse bias reaches the breakthrough voltage of the PN junction, thereby further improving the breakthrough voltage and hence achieving a technical effect of further improving the operating voltage of the high-voltage LDMOS integrated device

DETAILED DESCRIPTION OF THE EMBODIMENTS

Embodiments of this application provide a high-voltage LDMOS integrated device so as to address the technical problem in the prior art of a complicated process and an increased cost as a result of the use of an epitaxial layer for an improvement in operating voltage of the high-voltage LDMOS integrated device, thus making it possible to achieve a technical effect of an improvement in operating voltage of the high-voltage LDMOS integrated device without an epitaxial layer.

In order to address the foregoing technical problem, a general idea of a technical solution according to the embodiments of the invention is as follows:

There is a high-voltage LDMOS integrated device, which is interdigitally structured in a plan view and which includes:

A first area corresponding to a source fingertip area, where a first sectional structure of the first area particularly includes:

A first drain; and

A first longitudinal voltage-withstanding buffer layer located below the first drain and consisted of a first deep N-well and a first low-voltage N-well, where the first low-voltage N-well is located in the first deep-N well, and the first deep-N well is located in a P-type substrate; and A second area non-overlapping with the first area, where a second sectional structure of the second area particularly includes:

A second drain; and

A second longitudinal voltage-withstanding buffer layer located below the second drain and consisted of a second deep N-well and a second low-voltage N-well, where the second low-voltage N-well is located in the second deep-N well, and the second deep-N well is located in the P-type substrate.

The foregoing technical solution will be described below in details with reference to the drawings and particular embodiments thereof in order to better understand the technical solution.

There is a high-voltage LDMOS integrated device, which is interdigitally structured in a plan view and which includes:

A first area corresponding to a source fingertip area, where a first sectional structure of the first area particularly includes:

A first drain; and

A first longitudinal voltage-withstanding buffer layer located below the first drain and consisted of a first deep N-well and a first low-voltage N-well, where the first low-voltage N-well is located in the first deep-N well, and the first deep-N well is located in a P-type substrate; and A second area without overlapping with the first area, where a second sectional structure of the second area particularly includes:

A second drain; and

A second longitudinal voltage-withstanding buffer layer located below the second drain and consisted of a second deep N-well and a second low-voltage N-well, where the second low-voltage N-well is located in the second deep-N well, and the second deep-N well is located in the P-type substrate.

Figure 1:
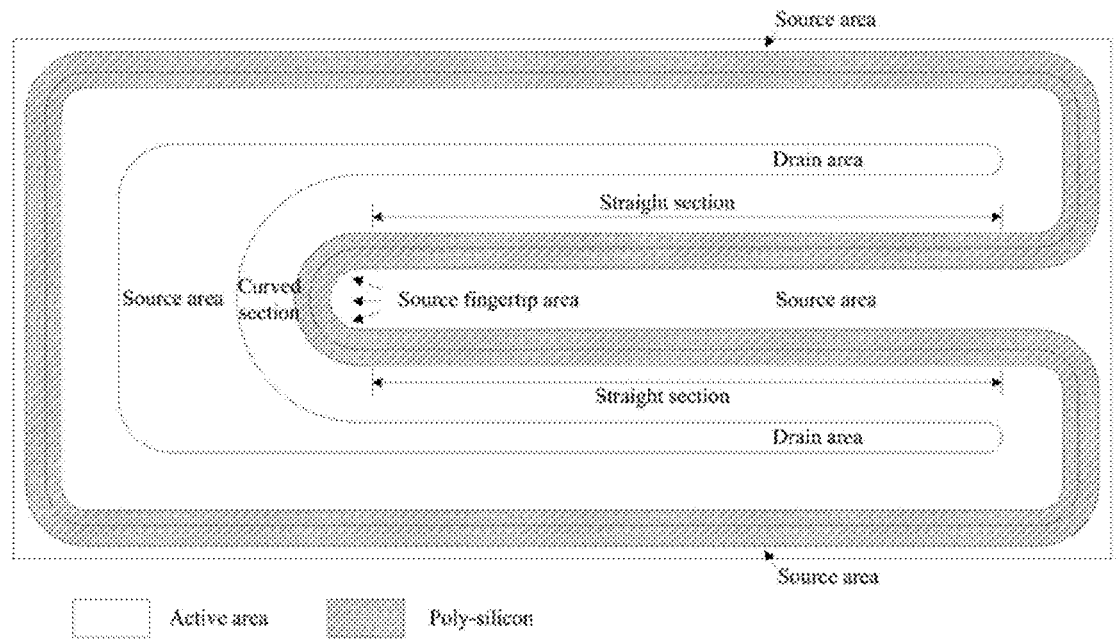
FIG. 1 is a schematic structural plan view of a high-voltage LDMOS integrated device in an embodiment of this application.

Specifically as illustrated in FIG. 1 illustrating a schematic structural plan view of a high-voltage LDMOS integrated device in an embodiment of this application, which is inter-digitally structured in a plan view and which includes a straight section and a curved section, where a source area and a drain area in the straight section are equal in width, and the source area and the drain area in the curved section are unequal in width, and an area in which the drain area is wider and the source area is narrower is referred to as a source fingertip area. With the same voltage applied, the electric field strength in the source fingertip area is higher than that in the straight section, that is, a breakthrough may occur more easily in the source fingertip area, and in order to avoid the source fingertip area from being broken through earlier than the straight section, there is a different device sectional structure used in the source fingertip area from that in the straight section, which are referred to as a first sectional structure and a second sectional structure.

Figure 2:
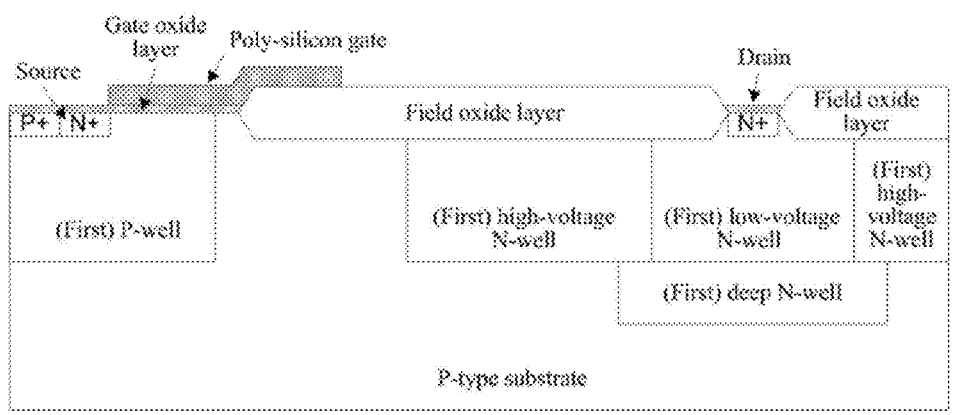
FIG. 2 is a first schematic structural sectional view of the high-voltage LDMOS integrated device in the embodiment of this application.
Figure 3:
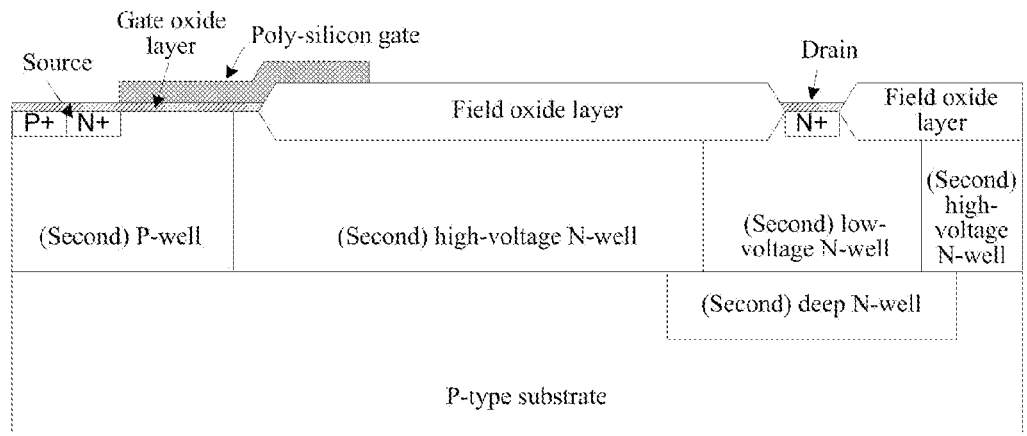
FIG. 3 is a second schematic structural sectional view of the high-voltage LDMOS integrated device in the embodiment of this application.

Specifically as illustrated in FIG. 2 and FIG. 3, the deep-N well and the low-voltage N-well are used as the longitudinal voltage-withstanding buffer layer of the drain, where the doping concentration of the deep N-well is low, so a PN junction consisted of the deep-N well and the P-type substrate can withstand high drain voltage, and the doping concentration of the low-voltage N-well is higher than that of the deep-N well, and this can prevent the buffer layer from being fully depleted longitudinally and consequently reaching the breakthrough voltage prematurely while the drain withstands high voltage.

Figure 4:
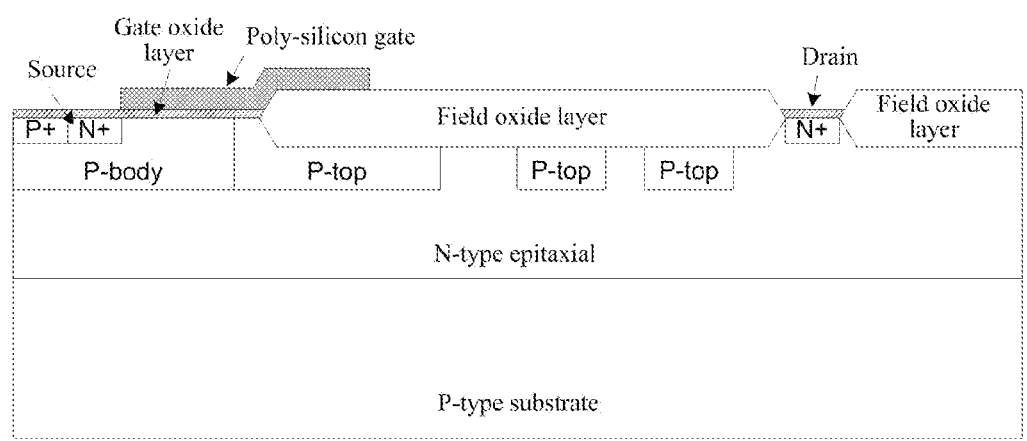
FIG. 4 is a first schematic structural sectional view of the high-voltage LDMOS integrated device in the prior art.
Figure 5:
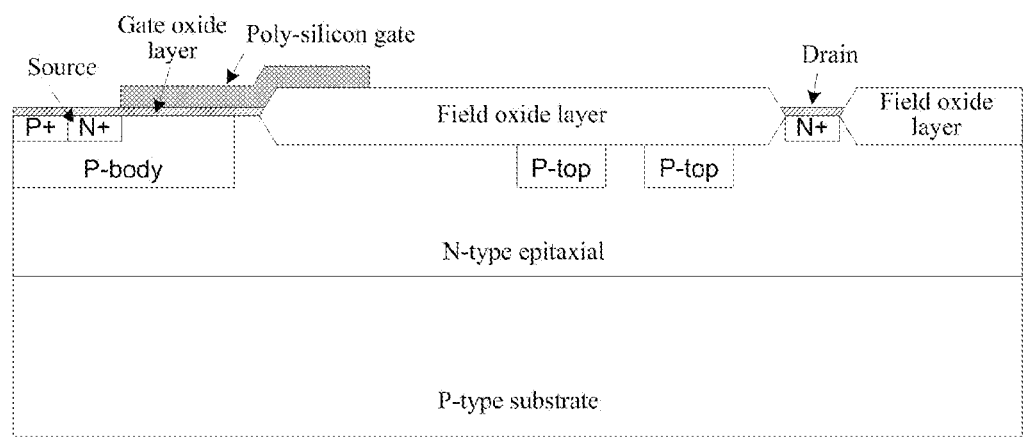
FIG. 5 is a second schematic structural sectional view of the high-voltage LDMOS integrated device in the prior art.

In the conventional method, as illustrated in FIG. 4 and FIG. 5, the simplex N-type epitaxial layer is typically used as the longitudinal voltage-withstanding buffer layer of the drain, and the N-type epitaxial layer area located right below the N+ drain area tends to be depleted upon a reverse bias, and for this structure, the breakthrough voltage of the drain has to be improved by increasing the thickness of the N-type epitaxial layer, but an increase in thickness of the epitaxial layer may greatly increase the cost of the process.

Specifically the resistivity of the P-type substrate ranges from 50 to 200 ohms·centimeter.

Specifically the depths of the first deep N-well and the second deep N-well range from 5 to 15 micrometers.

The first sectional structure further includes:

A first body area located in the P-type substrate and consisted of a first P-well.

The second sectional structure further includes:

A second body area located in the P-type substrate and consisted of a second P-well.

Specifically as illustrated in FIG. 2 and FIG. 3, the P-well is used as the body area: the depth of the P-well is slightly different from a high-voltage N-well and the low-voltage N-well, and P-well doping can be performed after (or before) the process steps of high-voltage N-well and low-voltage N-well doping and then the P-well can be formed through diffusion (junction pushing) together with the high-voltage N-well and the low-voltage N-well. Since the high-voltage N-well, the low-voltage N-well and the P-well are all common structures in a CMOS process, so the P-well can be used as the body area for a simplified process flow and easy compatibility with the CMOS process.

In the prior art, as illustrated in FIG. 4 and FIG. 5, body area doping is typically performed after the poly-silicon gate is fabricated, and the body area (P-body) is formed through diffusion (junction pushing), and since both the N-well and the P-well necessary for the CMOS process have been formed before the poly-silicon gate is fabricated, this traditional method in which the body area is fabricated after the process step of the poly-silicon gate requires an additional process step and is incompatible with the CMOS process.

Specifically it is preferable here that the first P-well and the second P-well are formed in an ion injection and doping process including two ion injections, one at higher energy than that of the other by a factor ranging from 2 to 10.

The first sectional structure further includes:

A first transversal voltage-withstanding buffer layer consisted of the P-type substrate, a first high-voltage N-well located in the P-type substrate and the first low-voltage N-well.

Specifically as illustrated in FIG. 2, in the first area (the source fingertip area), the P-type substrate, the first high-voltage N-well and the first low-voltage N-well are used as a first transversal voltage-withstanding buffer layer of the first drain: both the doping concentration of the first high-voltage N-well and the doping concentration of the P-type substrate are low, and the reverse breakthrough voltage of the PN junction consisted of them is high, so the first high-voltage N-well is fully depleted and the first low-voltage N well is partially depleted before a reverse bias reaches the breakthrough voltage of the PN junction, thereby facilitating an improvement in breakthrough voltage of the LDMOS.

In the prior art, as illustrated in FIG. 4, a P-type field-lowering ring (P-top) is fabricated in the first area to thereby improve the breakthrough voltage, and there is a high process cost of this method.

Specifically the doping concentration of the formed first low-voltage N-well ranges from 3 to 10 times that of the first high-voltage N-well. The doping concentration of the first low-voltage N-well ranges from 3 to 10 times that of the first deep N-well.

Specifically the depths of the first high-voltage N-well, the first low-voltage N-well and the first P-well all range from 2 to 10 micrometers, and the depth of the first deep N-well ranges from 1.5 to 3 times the depth of the first low-voltage N-well, and the transversal size of the first deep N-well ranges from 1.2 to 10 times that of the first low-voltage N-well.

The second transversal sectional structure further includes:

A second transversal voltage-withstanding buffer layer consisted of a second high-voltage N-well located in the P-type substrate and the second low-voltage N-well.

Specifically as illustrated in FIG. 2, in the second area (the other area than source fingertip area), the second high-voltage N-well and the second low-voltage N-well are used as a second transversal voltage-withstanding buffer layer of the second drain, where the doping concentration of the second high-voltage N-well is low, and the doping concentration of the second low-voltage N-well are high, and when the second drain withstands high voltage, the second high-voltage N-well is fully depleted and the second low-voltage N well is partially depleted. Since the breakthrough voltage of the drain of the LDMOS is related directly to the width of the transversal depleted layer, the breakthrough voltage of the LDMOS becomes higher with a larger width of the transversal depleted layer in a specific range, so that full depletion of the high-voltage N-well facilitates an improvement in breakthrough voltage of the LDMOS, and partial depletion of the low-voltage N-well can prevent the buffer layer from being fully depleted horizontally and consequently reaching the breakthrough voltage prematurely while the drain withstands high voltage.

In the prior art, as illustrated in FIG. 5, a P-type field-lowering ring (P-top) is fabricated on the surface of the N-type epitaxial layer to thereby improve the breakthrough voltage, and there is a high process cost of this method.

Specifically the doping concentration of the formed second low-voltage N-well ranges from 3 to 10 times that of the second high-voltage N-well. The doping concentration of the second low-voltage N-well ranges from 3 to 10 times that of the second deep N-well.

Specifically the depths of the second high-voltage N-well, the second low-voltage N-well and the second P-well all range from 2 to 10 micrometers, and the depth of the second deep N-well ranges from 1.5 to 3 times the depth of the second low-voltage N-well, and the transversal size of the second deep N-well ranges from 1.2 to 10 times that of the second low-voltage N-well.

Specifically it is preferable here that the first deep N-well and the second deep N-well are formed with the same doping concentration of the first deep N-well and the second deep N-well, thereby allowing this to be performed in the same ion injection and diffusion process and simplifying the process flow.

Specifically it is preferable here that the first high-voltage N-well and the second high-voltage N-well with the same doping concentration of the first high-voltage N-well and the second high-voltage N-well, thereby allowing this to be performed in the same ion injection process and simplifying the process flow.

Specifically it is preferable here that the first low-voltage N-well and the second low-voltage N-well with the same doping concentration of the first low-voltage N-well and the second low-voltage N-well, thereby allowing this to be performed in the same ion injection process and simplifying the process flow.

Specifically it is preferable here that the first P-well and the second P-well with the same doping concentration of the first P-well and the second P-well, thereby allowing this to be performed in the same ion injection process and simplifying the process flow.

Specifically it is preferable here that the high-voltage N-well, the low-voltage N-well and the P-well are formed by forming all the high-voltage N-well, the low-voltage N-well and the P-well concurrently to the same predetermined depth through only one diffusion (junction pushing) after ions are injected for doping in the high-voltage N-well, the low-voltage N-well and the P-well.

Furthermore the deep N-well, the high-voltage N-well, the low-voltage N-well and the P-well are all common structures in a CMOS process, so the LDMOS according to the invention can be easily compatible with the CMOS process.

The high-voltage LDMOS integrated device further includes a gate oxide layer formed in a third area on the first area and the second area.

Specifically the thickness of the formed gate oxide layer ranges from 150 to 1500 angstroms.

Specifically the high-voltage LDMOS integrated device further includes a field oxide layer formed in a fourth area non-overlapping with the third area, where the fourth area belongs to the first area or the second area.

Specifically the thickness of the formed field oxide layer ranges from 2000 to 20000 angstroms.

The high-voltage LDMOS integrated device further includes a poly-silicon gate formed in a fifth area on the third area or the fourth area.

Specifically the thickness of the formed poly-silicon gate ranges from 1000 to 10000 angstroms.

The high-voltage LDMOS integrated device further includes P+ and N+ sources formed below the gate oxide layer in the third area non-overlapping with the fifth area.

With the high-voltage LDMOS integrated device according to the invention and the preferred solutions thereof, the operating voltage thereof can reach 200 to 1000 volts without an epitaxial, and its manufacturing process is easily compatible with the existing process of manufacturing a CMOS integrated circuit.

The technical solutions in the foregoing embodiments of the invention have at least the following technical effects or advantages:

1. In the embodiments of the invention, the deep N-well and the low-voltage N-well are used as the longitudinal voltage-withstanding buffer layer of the drain, and since the doping concentration of the deep N-well is low, the PN junction consisted of the deep N-well and the P-type substrate can withstand high voltage of the drain; and since the doping concentration of the low-voltage N-well is higher than that of the deep N-well, the buffer layer can be prevented from being fully depleted longitudinally and consequently reaching the breakthrough voltage prematurely while the drain withstands high voltage, thereby improving the operating voltage of the high-voltage LDMOS integrated device above 200 volts. Since both the deep N-well and the low-voltage N-well are common structures in a CMOS process, it is possible to address effectively the problem in the prior art of a complicated process and an increased cost as a result of the use of an epitaxial layer for an improvement in operating voltage of the high-voltage LDMOS integrated device and to further achieve technical effects of a simple and convenient process at a low cost while improving the operating voltage of the high-voltage LDMOS integrated device.

2. In the embodiments of the invention, the P-well is used as the body area, and since the depth of the P-well is slightly different from the high-voltage N-well and the low-voltage N-well, P-well doping can be performed after (or before) the process steps of high-voltage N-well and low-voltage N-well doping, and then the P-well can be formed through diffusion (junction pushing) together with the high-voltage N-well and the low-voltage N-well. Since the high-voltage N-well, the low-voltage N-well and the P-well are all common structures in the CMOS process, so the P-well can be used as the body area for a simplified process flow and easy compatibility with the CMOS process.

3. In the embodiments of the invention, in the second area, the high-voltage N-well and the low-voltage N-well are used as the transversal voltage-withstanding buffer layer of the drain; and the doping concentration of the high-voltage N-well is low, and the doping concentration of the low-voltage N-well are high, so when the drain withstands high voltage, the high-voltage N-well is fully depleted and the low-voltage N well is partially depleted. Since the breakthrough voltage of the drain of the LDMOS is related directly to the width of the transversal depleted layer, full depletion of the high-voltage N-well facilitates an improvement in breakthrough voltage of the LDMOS, and partial depletion of the low-voltage N-well can prevent the buffer layer from being fully depleted horizontally and consequently reaching the breakthrough voltage prematurely while the drain withstands high voltage, thereby achieving a technical effect of further improving the operating voltage of the high-voltage LDMOS integrated device 4. In the embodiments of the invention, in the first area, the P-type substrate, the high-voltage N-well and the low-voltage N-well are used as the transversal voltage-withstanding buffer layer of the drain; and both the doping concentration of the high-voltage N-well and the doping concentration of the P-type substrate are low, and the reverse breakthrough voltage of the PN junction consisted of them is high, so the high-voltage N-well is fully depleted and the low-voltage N well is partially depleted before a reverse bias reaches the breakthrough voltage of the PN junction, thereby further improving the breakthrough voltage and hence achieving a technical effect of further improving the operating voltage of the high-voltage LDMOS integrated device Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

What is claimed is:

1. A high-voltage LDMOS integrated device, interdigitally structured in a plan view, comprising:
    a first area corresponding to a source fingertip area, wherein a first sectional structure of the first area includes:
        a first drain; and
        a first longitudinal voltage-withstanding buffer layer located below the first drain and consisted of a first deep N-well and a first low-voltage N-well, wherein the first low-voltage N-well is located in the first deep-N well, and the first deep-N well is located in a P-type substrate; and
    a second area non-overlapping with the first area, wherein a second sectional structure of the second area includes:
        a second drain; and
        a second longitudinal voltage-withstanding buffer layer located below the second drain and consisted of a second deep N-well and a second low-voltage N-well, wherein the second low-voltage N-well is located in the second deep-N well, and the second deep-N well is located in the P-type substrate.

2. The high-voltage LDMOS integrated device according to claim 1, wherein the first sectional structure further includes:
    a first body area located in the P-type substrate and consisted of a first P-well.

3. The high-voltage LDMOS integrated device according to claim 1, wherein the second sectional structure further includes:
    a second body area located in the P-type substrate and consisted of a second P-well.

4. The high-voltage LDMOS integrated device according to claim 1, wherein the first sectional structure further includes:
    a first transversal voltage-withstanding buffer layer consisted of the P-type substrate, a first high-voltage N-well located in the P-type substrate and the first low-voltage N-well.

5. The high-voltage LDMOS integrated device according to claim 1, wherein the second sectional structure further includes:
    a second transversal voltage-withstanding buffer layer consisted of a second high-voltage N-well located in the P-type substrate and the second low-voltage N-well.

6. The high-voltage LDMOS integrated device according to claim 1, further comprising a gate oxide layer formed in a third area on the first area and the second area.

7. The high-voltage LDMOS integrated device according to claim 6, further comprising a field oxide layer formed in a fourth area non-overlapping with the third area, wherein the fourth area belongs to the first area or the second area.

8. The high-voltage LDMOS integrated device according to claim 7, further comprising a poly-silicon gate formed in a fifth area on the third area or the fourth area.

9. The high-voltage LDMOS integrated device according to claim 8, further comprising P+ and N+ sources formed below the gate oxide layer in the third area non-overlapping with the fifth area.

* * * * *